(12) United States Patent
Komatsu et al.

(10) Patent No.: US 7,911,064 B2
(45) Date of Patent: Mar. 22, 2011

(54) MOUNTED BODY AND METHOD FOR MANUFACTURING THE SAME

(75) Inventors: Shingo Komatsu, Osaka (JP); Seiichi Nakatani, Osaka (JP); Seiji Karashima, Osaka (JP); Toshiyuki Kojima, Kyoto (JP); Takashi Kitae, Osaka (JP); Yoshihisa Yamashita, Kyoto (JP)

(73) Assignee: Panasonic Corporation, Osaka (JP)

( * ) Notice: Subject to any disclaimer, the term of this patent is extended or adjusted under 35 U.S.C. 154(b) by 233 days.

(21) Appl. No.: 11/908,087

(22) PCT Filed: Feb. 28, 2006

(86) PCT No.: PCT/JP2006/303713
§ 371 (c)(1),
(2), (4) Date: Sep. 7, 2007

(87) PCT Pub. No.: WO2006/095602
PCT Pub. Date: Sep. 14, 2006

(65) Prior Publication Data
US 2009/0230546 A1    Sep. 17, 2009

(30) Foreign Application Priority Data
Mar. 7, 2005  (JP) ................... 2005-061963

(51) Int. Cl.
*H01L 21/44* (2006.01)
*H01L 23/52* (2006.01)
*H01L 23/40* (2006.01)
*H01L 23/48* (2006.01)
*H01L 21/00* (2006.01)

(52) U.S. Cl. . 257/777; 257/737; 257/778; 257/E21.508; 257/E23.021; 257/E25.013; 438/108; 438/615; 438/616

(58) Field of Classification Search ............... 257/737, 257/777, 778, E21.508, E23.021, E25.013; 438/108, 615–616
See application file for complete search history.

(56) References Cited

U.S. PATENT DOCUMENTS

| | | | |
|---|---|---|---|
| 5,492,863 A | * | 2/1996 | Higgins, III .................. 438/610 |
| 5,769,996 A | * | 6/1998 | McArdle et al. ............ 156/272.4 |
| 6,100,594 A | | 8/2000 | Fukui et al. |
| 6,110,399 A | | 8/2000 | McArdle et al. |

(Continued)

FOREIGN PATENT DOCUMENTS

EP    0 692 137    10/2002

(Continued)

*Primary Examiner* — Zandra Smith
*Assistant Examiner* — Jeremy J Joy
(74) *Attorney, Agent, or Firm* — Hamre, Schumann, Mueller & Larson, P.C.

(57) ABSTRACT

A mounted body of the present invention includes: a multilayer semiconductor chip 20 including a plurality of semiconductor chips 10 (10a, 10b) that are stacked; and a mounting board 13 on which the multilayer semiconductor chip 20 is mounted. In this mounted body, each of the semiconductor chips 10 (10a, 10b) in the multilayer semiconductor chip 20 has a plurality of element electrodes 12 (12a, 12b) on a chip surface 21 (21a, 21b) facing toward the mounting board 13. On the mounting board 13, electrode terminals 14 are formed so as to correspond to the plurality of element electrodes (12a, 12b), respectively, and the electrode terminals 14 of the mounting board and the element electrodes (12a, 12b) are connected electrically to each other via solder bump formed as a result of assembly of solder particles. With this configuration, a mounted body on which a stacked package is mounted can be manufactured easily.

13 Claims, 11 Drawing Sheets

U.S. PATENT DOCUMENTS

| | | | |
|---|---|---|---|
| 6,142,609 A * | 11/2000 | Aoki | 347/50 |
| 6,229,217 B1 | 5/2001 | Fukui et al. | |
| 6,335,571 B1 * | 1/2002 | Capote et al. | 257/787 |
| 6,352,879 B1 | 3/2002 | Fukui et al. | |
| 6,369,448 B1 * | 4/2002 | McCormick | 257/777 |
| 6,399,426 B1 * | 6/2002 | Capote et al. | 438/127 |
| 7,323,360 B2 * | 1/2008 | Gonzalez et al. | 438/108 |
| 2003/0080397 A1 * | 5/2003 | Sakuyama et al. | 257/667 |
| 2003/0080437 A1 * | 5/2003 | Gonzalez et al. | 257/778 |

FOREIGN PATENT DOCUMENTS

| | | |
|---|---|---|
| JP | 5-75015 | 3/1993 |
| JP | 08-508610 | 10/1996 |
| JP | 11-3969 | 1/1999 |
| JP | 11-204720 | 7/1999 |
| JP | 2000-294722 | 10/2000 |
| JP | 2000-349228 | 12/2000 |
| JP | 2002-9227 | 1/2002 |
| JP | 2002-33443 | 1/2002 |
| JP | 2002-170921 | 6/2002 |
| JP | 2002-373966 | 12/2002 |
| JP | 2002373966 A * | 12/2002 |
| JP | 2004-153210 | 5/2004 |
| JP | 2004-273706 | 9/2004 |
| WO | 95/20820 | 3/1995 |

* cited by examiner

MOUNTED BODY AND METHOD FOR MANUFACTURING THE SAME

TECHNICAL FIELD

The present invention relates generally to a mounted body and a method for manufacturing the same. In particular, the present invention relates to a mounted body in which a semiconductor element (e.g., a chip-stacked package) is mounted on a mounting board and a method for manufacturing the same.

BACKGROUND ART

Accompanying the miniaturization and performance enhancement of electronic equipment in recent years, it has been demanded that semiconductor elements (semiconductor packages) have a higher density and become smaller and thinner. To address this demand, CSPs (Chip Size Packages), which are semiconductor elements whose sizes are reduced to nearly a chip size, are now becoming widespread.

Furthermore, in mobile information equipment etc., a multi-chip module in which semiconductor chips are arrayed and mounted in the plane direction has been employed with the aim of assigning an added value such as a memory or increasing the capacity. In order to reduce the mounting area of this multi-chip module, the configuration called a "stacked package", in which a plurality of semiconductor chips are stacked to increase the packaging density, has been proposed, and also the stacked package adapted to be a CSP has been proposed (Patent Documents 1 to 10).

FIG. 13 shows a stacked package 1000 disclosed in Patent Document 1. In the stacked package 1000, stacked semiconductor chips 101 and 102 are connected to a wiring layer 104 on an insulating substrate 103 via bonding wires 108, and molded with a resin 109. External terminals 110 used for mounting are formed on the rear surface of the insulating substrate 103. Patent Document 2 also discloses a stacked package with a similar configuration.

Also, there has been proposed a stacked package 1100 in which wire bonding and flip chip bonding are used in combination, as shown in FIG. 14 (see Patent Document 3). In the stacked package 1100 shown in FIG. 14, a semiconductor chip 101 is connected with wires 108 whereas a semiconductor chip 102 is connected with bumps 107, and an underfill resin 105 is formed between the semiconductor chip 102 and the wiring board 103. Patent Documents 4 and 5 also disclose similar configurations.

Furthermore, there has been proposed a stacked package 1200 obtained by stacking a plurality of flash memories 101, each of which is flip-chip mounted on an interposer 111, with spacer substrates 112, 122 intervening therebetween, as shown in FIG. 15 (Patent Document 6). Patent Document 7 also discloses a similar configuration.

Moreover, Patent Documents 8, 9, and 10 disclose stacked packages that basically employ flip-chip mounting. FIG. 16 shows a stacked package 1300 disclosed in Patent Document 8. In the stacked package 1300 shown in FIG. 16, semiconductor chips 101a to 101c are flip-chip mounted using wiring boards 103a to 103c, respectively. A similar configuration is disclosed in Patent Document 9. FIG. 17 shows a stacked package 1400 disclosed in Patent Document 10. In the stacked package 1400 shown in FIG. 17, a semiconductor chip 101 is connected to wiring patterns 104 via bumps 107, whereas a semiconductor chip 102 is connected to wiring patterns 104 via bumps 107 and lead electrodes 113.

Since the stacked packages shown in FIGS. 13 to 17 have configurations in which a plurality of semiconductor chips are stacked, they can achieve a higher packaging density as compared with the case where semiconductor chips are mounted two-dimensionally. However, the inventors of the present invention revealed that the currently proposed configurations of stacked package have the following problems by conducting a keen study without being restricted to existent knowledge. For the sake of simplicity in illustration, FIGS. 18 to 20 show the configurations of the stacked packages 1000, 1100, and 1200 shown in FIGS. 13 to 15, respectively, in the forms allowing easy comparison.

First, in the stacked package 1000 shown in FIG. 18, the respective semiconductor chips (101, 102) can be mounted on the wiring board 103 by wire bonding (WB). However, with this configuration, a height (a loop height of the wires 108) sufficient for performing the WB is necessary, and also a large mounting area for performing the WB needs to be provided on the wiring board 103 side. Therefore, it is inevitable that restrictions are imposed on thickness reduction and miniaturization. Furthermore, since this configuration is based on the WB, an area array-type semiconductor chip cannot be used in this configuration while this configuration is applicable to the case where only peripheral-type semiconductor chips are used. Moreover, since the WB is performed for many wires, the manufacturing process becomes complicated as the number of WB steps performed for the respective wires increases. Besides, when performing the WB with respect to the multistage chips, technical difficulties or restrictions are liable to occur. In particular, since the wires used for the uppermost semiconductor chip need to cover a long connection distance, a technique difficulty arises that the loop height of the wires needs to be small.

Next, in the case of the stacked package 1100 shown in FIG. 19, since both the WB and flip chip bonding (FC) are employed, the complication of the manufacturing process by performing both the steps is inevitable. Furthermore, since the WB is employed, the configuration also suffers the restrictions caused by the height (the loop height) of the wires and the mounting area on the wiring board 103 side in the WB, as in the case of the example shown in FIG. 18. Thus, a problem is caused when attempting further thickness reduction and miniaturization.

In the case of the stacked package 1200 shown in FIG. 20, the interposers 111 and the spacer substrates 112 are necessary, which leads to cost increase and also complicates the manufacturing process. Moreover, since the spacer substrates 112 are used, the thickness reduction becomes difficult. In the case of the stacked packages 1300 and 1400 shown in FIGS. 16 and 17, the manufacturing processes are liable to be complicated.

Patent Document 1: JP 11-204720 A
Patent Document 2: JP 2000-349228 A
Patent Document 3: JP 2004-273706 A
Patent Document 4: JP 11(1999)-3969 A
Patent Document 5: JP 2000-294722 A
Patent Document 6: JP 2002-9227 A
Patent Document 7: JP 5(1993)-75015 A
Patent Document 8: JP 2004-153210 A
Patent Document 9: JP 2002-33443 A
Patent Document 10: JP 2002-170921 A

DISCLOSURE OF INVENTION

The present invention has been made in light of the above-described problems. The present invention provides a novel mounted body on which a stacked package is mounted and also a technique by which such a mounted body can be manufactured easily.

A mounted body according to the present invention includes: a multilayer semiconductor chip comprising a plurality of semiconductor chips that are stacked; and a mounting board on which the multilayer semiconductor chip is mounted. Each of the semiconductor chips in the multilayer semiconductor chip has a plurality of element electrodes on a chip surface facing toward the mounting board. On the mounting board, electrode terminals are formed so as to correspond to the plurality of element electrodes, respectively. The electrode terminals of the mounting board and the element electrodes are connected electrically to each other via solder bumps formed as a result of assembly of solder particles.

A method for manufacturing a mounted body according to the present invention includes the steps of: providing a solder resin paste between a multilayer semiconductor chip comprising a plurality of semiconductor chips that are stacked and a mounting board on which the multilayer semiconductor chip is mounted, the solder resin paste containing a resin, a solder powder, and a convection additive that boils when heated; and heating the solder resin paste so that the convection additive boils to cause convection in the resin, thus causing the solder powder assembles to form a solder bump, whereby an element electrode of each semiconductor chip of the multilayer semiconductor chip and an electrode terminal formed on the mounting board so as to correspond to the element electrode are connected electrically to each other collectively.

Another method for manufacturing a mounted body according to the present invention includes the steps of: providing a solder resin paste between a first semiconductor chip and a mounting board on which the first semiconductor chip is mounted, the solder resin paste containing a resin, a solder powder, and a convection additive that boiled when heated; heating the solder resin paste so that the convection additive boils to cause convection in the resin, thus causing the solder powder assembles to form a solder bump, whereby an element electrode of the first semiconductor chip and an electrode terminal formed on the mounting board so as to correspond to the element electrode are connected electrically to each other collectively; joining a second semiconductor chip having a principal surface to be joined to a rear surface of the first semiconductor chip and a second element electrode formed on the principal surface to the rear surface of the first semiconductor chip, and providing the solder resin paste between the mounting board and the second semiconductor chip; and heating the solder resin paste so that the convection additive boils to cause convection in the resin, thus causing the solder powder assembles to form a solder bump, whereby the element electrode of the second semiconductor chip and an electrode terminal formed on the mounting board so as to correspond to the element electrode are connected electrically to each other collectively.

DESCRIPTION OF THE INVENTION

Figure 1:
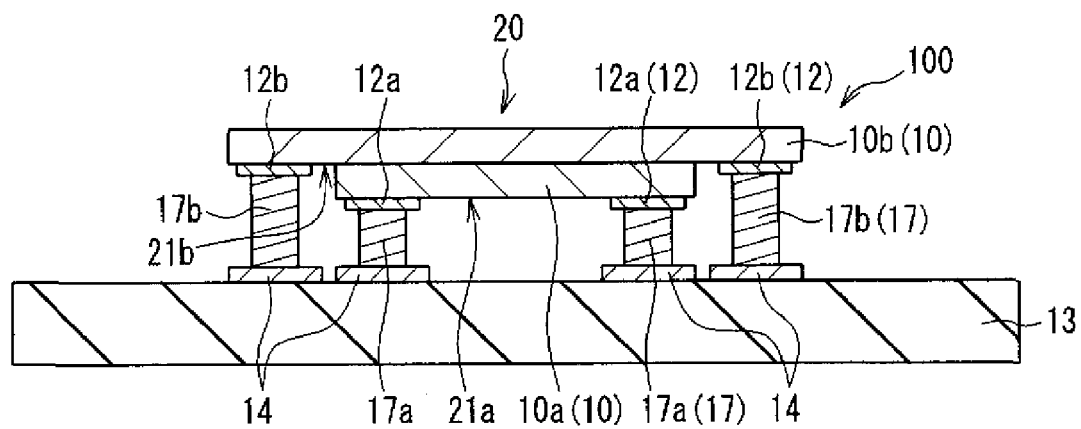
FIG. 1 is a cross-sectional view schematically showing the configuration of a mounted body according to Embodiment 1 of the present invention.

In the mounted body according to the present invention, the element electrode of the semiconductor element is connected electrically to the electrode terminal of the wiring pattern formed on the mounting board via a solder connector that is formed by self-assembly of solder particles. The solder connector is formed by heating a solder resin paste containing the solder particles, a resin, and a convection additive so that the convection additive boils to cause convection, thus causing the solder particles to self-assemble so as to connect the element electrode and the electrode terminal electrically.

In the present invention, the multilayer semiconductor chip may include a first semiconductor chip having a surface on which the element electrode is formed and a rear surface opposing said surface and a second semiconductor chip having a principal surface to which the rear surface of the first semiconductor chip is joined and the element electrode formed in a peripheral region of the principal surface.

The multilayer semiconductor chip may include at least three semiconductor chips.

Preferably, a space between the multilayer semiconductor chip and the mounting board is filled with a resin. With the presence of the resin, it is possible to make the mounted body mechanically rigid and stable. As this resin, a resin component of a solder resin paste that will be described can be used as it is.

It is preferable that in the muitilayer semiconductor chip, at least the semiconductor chip adjacent to the mounting board is a thin semiconductor chip having a thickness from 10 µm to 100 µm.

The multilayer semiconductor chip may be a chip-on-chip (COC) module in which the first semiconductor chip is connected electrically to the second semiconductor chip via a solder bump.

The first manufacturing method according to the present invention is a method by which a plurality of semiconductor chips are connected to a mounting board collectively with the use of a multilayer semiconductor chip in which the plurality of semiconductor chips are stacked.

The second manufacturing method according to the present invention is a method by which semiconductor chips are connected to a mounting board one by one.

In the first and second manufacturing methods, it is preferable that in the multilayer semiconductor chip, at least a semiconductor chip adjacent to the mounting board is a thin semiconductor chip having a thickness of 100 µm or less.

Furthermore, it is preferable that the solder particles have a melting point in the range from 10° C. to 330° C.

Furthermore, it is preferable that the solder particles have an average particle diameter in the range from 1 to 50 µm.

Furthermore, it is preferable that the heating temperature of the solder resin paste is equal to or higher than the melting point of the solder.

According to the present invention, in a mounted body in which a multilayer semiconductor chip is mounted on a mounting board, electrode terminals of the mounting board and element electrodes of the semiconductor chips are connected electrically to each other collectively via solder bumps formed in a self-assembled manner. Thus, the mounted body provided with the multilayer semiconductor chip can be manufactured easily.

The solder resin paste includes a resin, solder particles, and a convection additive that boils when the resin is heated. A thermosetting resin (e.g., epoxy resin) is used as the resin, and Pb free solder particles are used as the solder particles. As the convection additive, a solvent (e.g., an organic solvent) can be used, examples of which include isopropyl alcohol (boiling point: 82.4° C.), butyl acetate (boiling point: 125° C. to 126° C.), butyl carbitol (diethylene glycol monobutyl ether, boiling point: 201.9° C.), and ethylene glycol (boiling point: 197.6° C.). The content of the convection additive in the resin is not particularly limited, and preferably is 0.1 to 20 wt %.

Note here that the "convection" of the convection additive means convection as a kinetic form, which may be in any form as long as the motion of the boiling convection additive in the resin gives kinetic energy to the solder particles dispersed in the resin, thereby promoting the movement of the solder particles. Note here that, in addition to the convection additive that boils to cause convection in itself, it is also possible to use a convection additive that generates gas (gas such as $H_2O$, $CO_2$, or $N_2$) when the resin is heated. Examples of such a convection additive include compounds containing crystal water, compounds decomposed by being heated, and foaming agents.

As the solder particles, any solder particles can be selected for use. Examples of the solder particles include those listed in Table 1 below. The materials given as examples in Table 1 can be used alone or in any appropriate combinations. As the material of the solder particles, it is preferable to use a material whose melting point is lower than the curing temperature of the thermosetting resin, because this allows, after the resin has been caused to flow to cause self-assembly of the solder particles, the resin to be heated further so as to be cured, thus achieving electric connection and encapsulation with the resin.

TABLE 1

| Composition of solder particles | Melting point (solidus) (° C.) |
|---|---|
| Sn—58Bi | 139 |
| Sn—37Pb | 183 |
| Sn—9Zn | 199 |
| Sn—3.0Ag—0.5Cu | 217 |
| Sn—3.5Ag | 221 |
| Sn—0.7Cu | 228 |
| 12Sn—2.0Ag—10Sb—Pb | 240 |

The melting point of the solder particles preferably is 10° C. to 330° C., more preferably 100° C. to 300° C., and particularly preferably 139° C. to 240° C. as shown in Table 1. When the melting point is lower than 10° C., the problem concerning the durability tends to occur. When the melting point is higher than 330° C., the selection of the resin becomes difficult.

The average particle diameter of the solder particles preferably is in the range from 1 to 30 µm, more preferably from 5 to 20 µm. When the average particle diameter is less than 1 µm, it becomes difficult to melt the solder particles due to the surface oxidation, and the formation of the electric connectors tends to take too much time. When the average particle diameter is more than 30 µm, it becomes difficult to obtain the electric connectors due to the sedimentation of the solder particles. Note here that the average particle diameter can be measured using a commercially available particle size distribution analyzer. For example, the average particle diameter can be measured using a laser diffraction particle size analyzer (LA920) available from HORIBA, Ltd., a laser diffraction particle size analyzer (SALD2100) available from Shimadzu Corporation, or the like.

Next, the resin will be described. Typical examples of the resin include: thermosetting resins such as epoxy resin, phenol resin, silicone resin, diallyl phthalate resin, furan resin, and melamine resin; thermoplastic resins such as polyester elastomer, fluororesin, polyimide resin, polyamide resin, and aramid resin; photocurable (ultraviolet curable) resins; and mixtures of at least two kinds thereof.

The mixing ratio by weight of the solder particles and the resin preferably is in the following range: conductive particles:resin=95 to 4:5 to 96, more preferably, solder particles:resin=70 to 30:30 to 70. It is preferable to use the solder particles and the resin after they have been mixed together homogenously. For example, 50 wt % of solder particles and 50 wt % of epoxy resin are mixed homogenously by a kneading machine, and the thus-obtained mixture is used. Note here that a paste in which the solder particles remain dispersed may be used, or a rein formed into a sheet form may be used.

Furthermore, in preferred examples of the present invention, lead-free solder alloy particles whose melting point is 200° C. to 230° C. can be used as the solder particles, for example. When the resin is a thermosetting resin, it is preferable that the curing temperature of the resin is higher than the melting point of the solder. With this configuration, it is possible to cure the resin during the steps of forming electric connectors and forming metal bumps, thus allowing the operation process to be shortened.

In the following, the mechanism by which solder connectors are formed in one example of the present invention will be described with reference to the drawings.

Figure 21A:
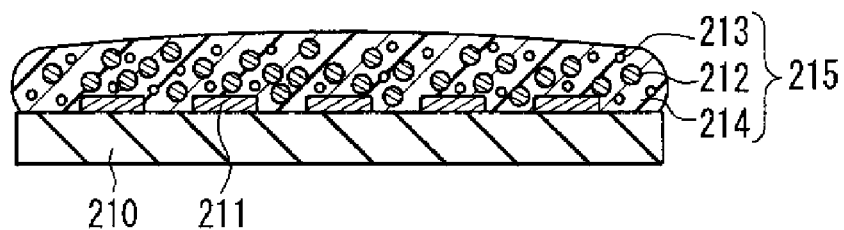
FIGS. 21A to 21C are cross-sectional views illustrating the mechanism by which solder connectors are formed in one example of the present invention.

First, as shown in FIG. 21A a solder resin paste 215 containing metal particles (e.g., solder powder) 212, a convection additive 213, and a resin 214 is supplied onto a circuit board 210 on which a plurality of connection terminals 211 are formed. The convection additive 213 boils to cause convection when the solder resin paste 215 is heated.

Figure 21B:
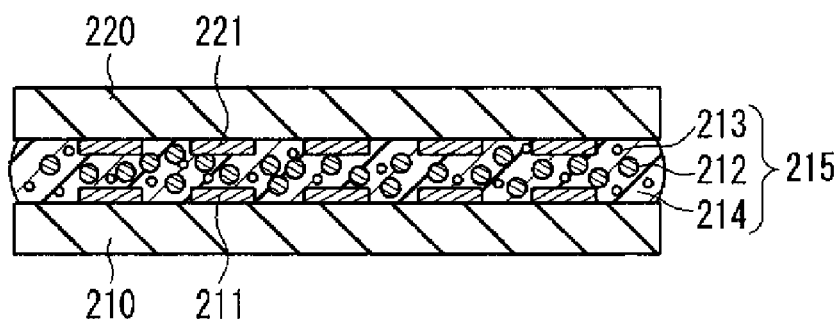

Next, as shown in FIG. 21B, a semiconductor chip 220 having a plurality of electrode terminals 221 is brought into contact with the surface of the solder resin paste 215. At this time, the semiconductor chip 220 is arranged so that the electrode terminals 221 thereof face the connection terminals 211 of the circuit board 210. In this state, the solder resin paste 215 is heated. The heating temperature of the solder resin paste 215 is set to be higher than the melting point of the metal particles 212 and the boiling point of the convection additive 213.

Figure 21C:
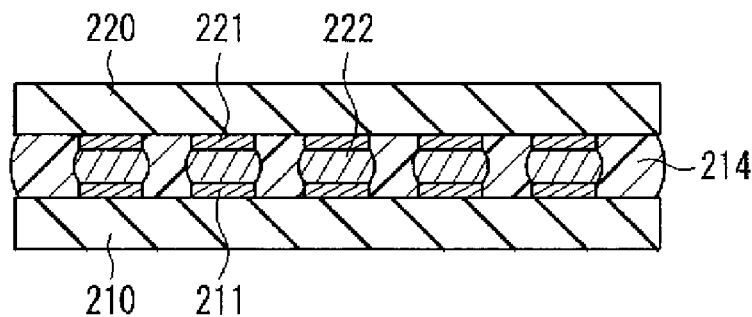

The metal particles 212 melted by the heating bind to each other in the solder resin paste 215, and self-assemble between each pair of the connection terminals 211 and the electrode terminals 221, which both have high wettability as shown in FIG. 21C. Thus, solder connectors 222 that electrically connect between the electrode terminals 221 of the semiconductor chip 220 and the connection terminals 211 of the circuit board 210 are formed. Thereafter, the resin 214 is cured or solidified, whereby the semiconductor chip 220 is fixed to the circuit board 210.

This technique is characterized in that, when the solder resin paste 215 is heated, the convection additive 213 boils to cause convection in the solder resin paste 215, thereby promoting the movement of the metal particles 212 dispersed in the solder resin paste 215. Thus, the binding of the metal particles 212 proceeds uniformly, and the solder connectors (the solder bumps) 222 can be formed in a self-assembled manner. In the above process, the resin 214 in the solder resin paste 215 is considered to serve as "sea" in which the metal particles can float and move freely. However, the binding process of the metal particles 212 completes within a very short time. Thus, even if the "sea" in which the metal particles 212 can move freely is provided, the binding proceeds only locally. Hence, the resin 214 serving as the "sea" and the promotion of the convection by the convection additive 212 are important. By using the resin 214 and the convection additive 212 in combination, the solder bumps 222 are formed in a self-assembled manner. It should be noted here that the solder bumps 222 are formed not only in a self-assembled manner but also in a self-aligned manner due to the nature of the solder bumps.

The inventors of the present invention came up with the above-described idea and further expanded the idea to finally achieve the present invention.

Hereinafter, the present invention will be described by way of embodiments with reference to the drawings. In the following description as to the drawings, elements having substantially the same functions are given the same reference numerals for the sake of simplicity in explanation. It should be noted that the present invention is by no means limited to the following embodiments.

Embodiment 1

First, a mounted body 100 according to an embodiment of the present invention will be described with reference to FIG. 1. FIG. 1 schematically shows the cross-sectional configuration of the mounted body 100 according to the present embodiment.

The mounted body 100 of the present embodiment includes a multilayer semiconductor chip 20 on which a plurality of semiconductor chips 10a, 10b are stacked and a mounting board 13 on which the multilayer semiconductor chip 20 is mounted. In each of the semiconductor chips 10a, 10b included in the multilayer semiconductor chip 20, a plurality of element electrodes 12a, 12b are formed on a chip surface 21a, 21b facing the mounting board 13. On the mounting board 13, electrode terminals 14 are formed so as to correspond to the plurality of element electrodes 12a, 12b.

The electrode terminals 14 of the mounting board 13 and the element electrodes 12a, 12b are connected electrically to each other via solder bumps 17a, 17b formed in a self-assembled manner. Note here that the solder bumps (solder members) 17 (17a, 17b) formed in a self-assembled manner are obtained by growing them on the element electrodes 12 and the electrode terminals 14 through a predetermined process, rather than by preparing solder bumps beforehand and placing them on the element electrodes 12a, 12b. The details of the predetermined process will be given later.

The metal (solder) used for forming the solder bumps (the solder members) 17 (17a, 17b) is a low melting point metal, examples of which include Sn—Ag based solders (including those to which Cu or the like has been added). The low melting point metal is not limited to the Sn—Ag based solders (including those to which Cu or the like has been added), and any low melting point metals having a melting point within the range from 10° C. to 330° C. can be used. Besides the Sn—Ag based solders, the solder powder also can be formed of, for example, Pb-free solders such as Sn—Zn based solders and Sn—Bi based solders, Pb—Sn eutectic solders, and low melting point metals such as Cu—Ag alloy. The shape of the solder bump 17 can be a substantially spherical shape with its central portion being expanded or, on the contrary, can be a cylindrical shape with its central portion being constricted. However, in FIG. 1, the solder bumps 17 having a cylindrical shape are shown for simplicity in representation. The actual shape of the solder bumps 17 is determined depending on various conditions.

The mounting board 13 shown in FIG. 1 is a rigid substrate (a typical printed board). The electrode terminals 14 formed on the mounting board 13 are made of copper, for example, and are formed as a part of a wiring circuit. Note here that it is also possible to use a flexible substrate as the mounting board 13.

The multilayer semiconductor chip 20 according to the present embodiment includes the first semiconductor chip 10a and the second semiconductor chip 10b. The second semiconductor chip 10b has the principal surface 21b to which the rear surface of the first semiconductor chip 10a is joined, and the element electrodes 12b are formed in a peripheral region of the principal surface 21b. In this example, the element electrodes 12a are formed in a peripheral region of the principal surface 21a of the first semiconductor chip 10a. However, the element electrodes 12a may be formed two-dimensionally on the principal surface 21a. Furthermore, the multilayer semiconductor chip 20 can be obtained by stacking at least three semiconductor chips. The semiconductor chips 10 included in the multilayer semiconductor chip 20 are bare chips, for example. The thickness of each of the semiconductor elements (the bare chips) 10 preferably is 30 to 600 μm, more preferably 50 to 400 μm, for example.

In the configuration of the present embodiment, it is preferable to use thin semiconductor chips as the semiconductor chips included in the multilayer semiconductor chip 20. There is no problem if the uppermost semiconductor chip (10b) is thick. However, it is preferable that the semiconductor chip (10a) positioned below the semiconductor chip (10b) is a thin semiconductor chip having a thickness of 10 μm or more and 100 μm or less, for example. In the semiconductor chip 10 (10b) other than the lowermost semiconductor chip, it is preferable that the element electrodes 12 (12b) are arranged in the peripheral region of the principal surface 21 (21b) (i.e., peripheral arrangement) in order to provide a joint area in the central portion of the principal surface 21 (21b). However, in the lowermost semiconductor chip 10 (10a), the arrangement of the element electrodes 12 (12a) can be either a peripheral arrangement or an area array arrangement.

Figure 2:
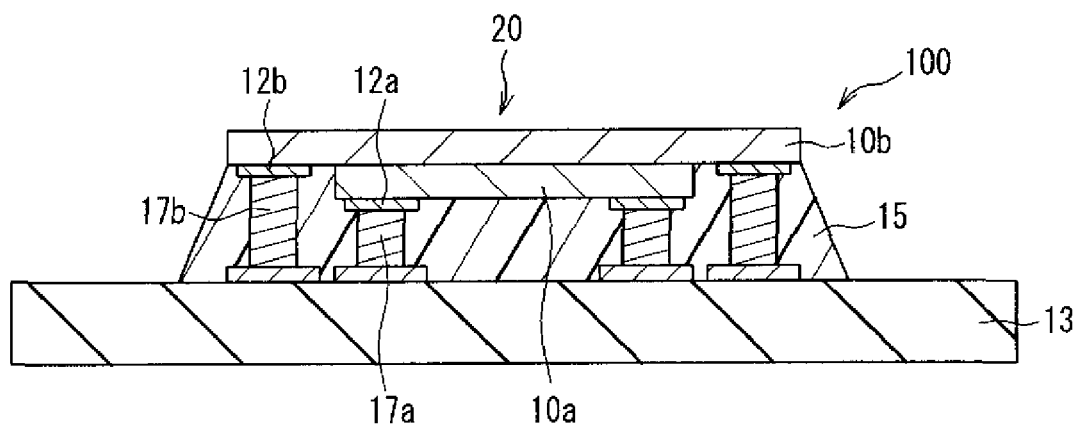
FIG. 2 is a cross-sectional view schematically showing the configuration of a mounted body according to Embodiment 1 of the present invention.

In the mounted body 100 according to the present embodiment, as shown in FIG. 2, a space between the multilayer semiconductor chip 20 and the mounting board 13 may be filled with a resin 15. The resin 15 serves as an underfill in flip chip mounting. In this example, a thermosetting resin such as epoxy resin is used as the resin 15.

Exemplary dimensions etc. of the mounted body shown in FIG. 1 or FIG. 2 are as follows. The lower semiconductor chip 10a has a thickness of 50 μm, and the distance between the chip surface 21a of the semiconductor chip 10a and the surface of the mounting board 30 is 30 μm. Therefore, the height of the solder bump 17a is about 30 μm, and the height of the solder bump 17b is about 80 μm. The wiring patterns of the mounting board 30 are formed at a pitch of 250 μm or less, and for example, they are formed at a pitch of 150 μm or 100 μm.

Figure 3A:
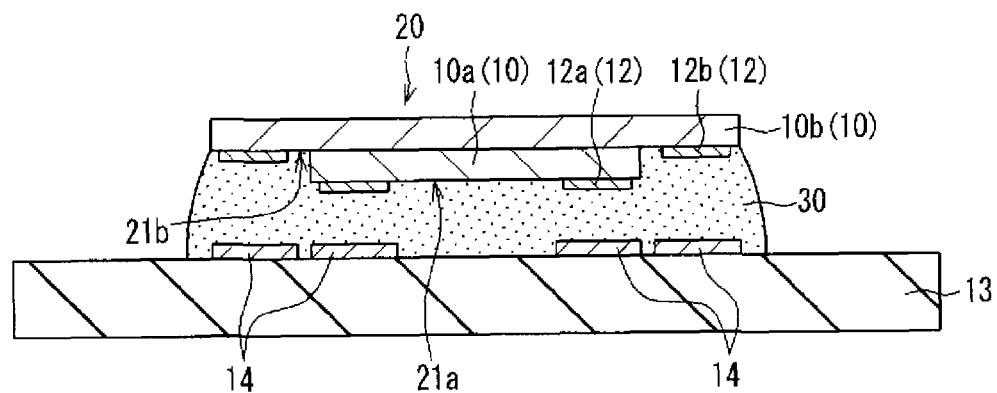
FIGS. 3A to 3C are cross-sectional views illustrating major steps in a method for manufacturing the mounted body according to Embodiment 1 of the present invention.
Figure 3B:
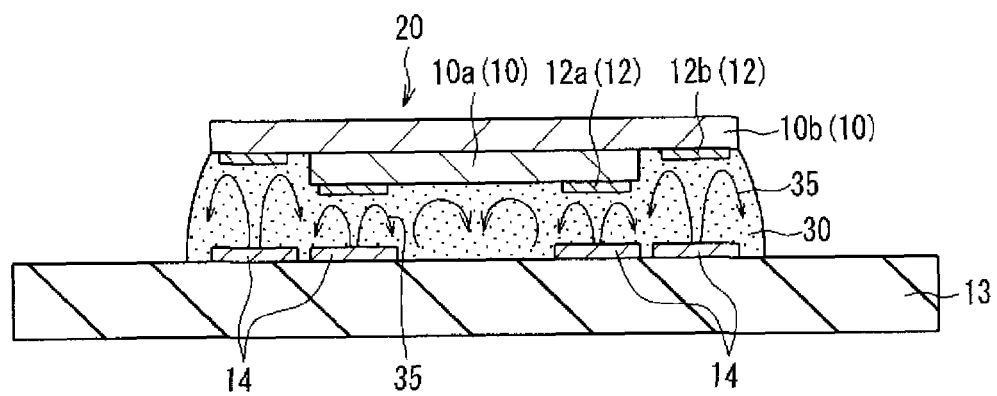
Figure 3C:
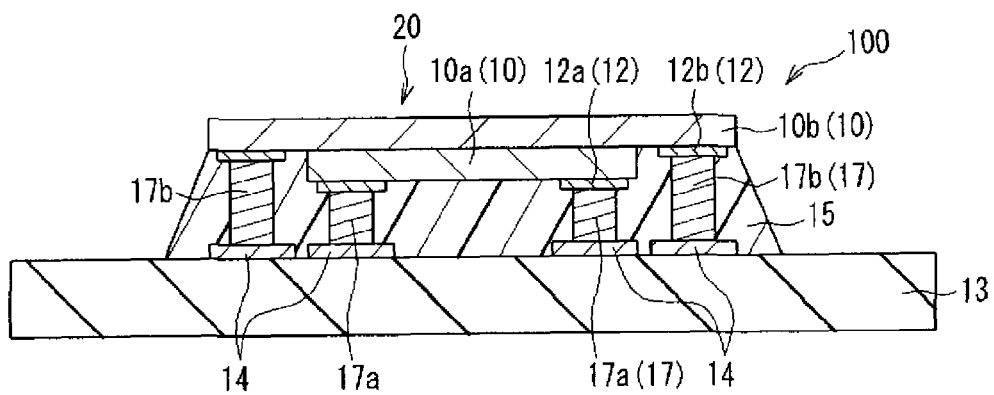

Next, a method for manufacturing the mounted body 100 according to the present embodiment will be described with reference to FIGS. 3A to 3C. FIGS. 3A to 3C are cross-sectional views illustrating major steps in the manufacturing method according to the present embodiment.

First, as shown in FIG. 3A, a solder resin paste 30 containing a convection additive that boils when a resin is heated and a solder powder is applied onto a mounting board 13, after which multilayer semiconductor chip 20 is placed on the mounting board 13 with the solder resin paste 30 intervening therebetween. Thus, the solder resin paste 30 covers electrode-formed surfaces (principal surfaces) 21a, 21b of the semiconductor chips 10a, 10b and a portion of the mounting board 13 (a portion including electrode terminals 14).

As described above, the solder resin paste 30 according to the present embodiment contains, in the resin, the solder powder and the convection additive that boils when the resin is heated. In other words, the solder resin paste 30 contains the resin, the solder powder dispersed in the resin, and the convection additive that boils when the resin is heated. In the present embodiment, a thermosetting resin (e.g., epoxy resin) is used as the resin, and a Pb-free solder powder is used as the solder powder. As the convection additive, a solvent (e.g., an organic solvent whose boiling point is high) can be used, examples of which include isopropyl alcohol, butyl acetate, butyl carbitol, and ethylene glycol. The content of the convection additive in the resin is not particularly limited, and preferably is 0.1 to 20 wt %.

Note here that the "convection" of the convection additive means convection as a kinetic form, which may be in any form as long as the motion of the boiling convection additive in the resin gives kinetic energy to the solder particles dispersed in the resin, thereby promoting the movement of the solder particles. Note here that, in addition to the convection additive that boils to cause convection in itself, it is also possible to use a convection additive that generates gas (gas such as $H_2O$, $CO_2$, or $N_2$) when the resin is heated. Examples of such a convection additive include compounds containing crystal water, compounds decomposed by being heated, and foaming agents.

Next, as shown in FIG. 3B, the solder resin paste 30 is heated so that the convection additive boils to cause convection 35 in the resin. In many cases, steam bursts out from between the semiconductor chip 10b and the mounting board 13 when the convection additive is boiled. This heating process is carried out in such a manner that the temperature at which the boiling of the convection additive is caused is equal to or higher than the melting point of the solder powder. The convection generated under the heated condition causes the self-assembly of the solder powder contained in the solder resin paste 30. That is, owing to the convection 35 caused by the convection additive, the solder powder in the solder resin paste self-assembles on the element electrodes 12 (12a, 12b) and the electrode terminals 14. Without the convection 35 (or boiling) by the convection additive, the growth of the solder powder cannot be promoted, so that aggregates (undissolved lumps) of the solder powder remain.

As the self-assembly of the solder powder proceeds, solder bumps 17 are formed between the element electrodes 12 (12a, 12b) and the electrode terminal 14 as shown in FIG. 3C. That is, by the solder bumps 17 (17a, 17b) formed in a self-assembled manner, the element electrodes 12 (12a, 12b) of the respective semiconductor chips 10 (10a, 10b) included in the multilayer semiconductor chip 20 and the electrode terminals 14 formed on the mounting board 13 so as to correspond to the element electrodes 12 are connected electrically to each other collectively. Note here that the element electrodes 12 and the electrode terminals 14 are connected directly to each other by the solder bumps 17.

The time required for forming the solder bumps 17 in FIGS. 3B and 3C is, for example, about 5 to 30 seconds, preferably about 5 seconds, although this may vary depending on the conditions under which the solder bumps 17 are formed. It is to be noted that the process for forming the solder bumps 17 may include a preheating step of heating the solder resin paste 30 beforehand.

A specific example will be given below. A mixture obtained by homogenously mixing 57 parts by weight of a bisphenol F type epoxy resin (Japan Epoxy Resins Co., Ltd., Epikote 806), 40 parts by weight of SnAgCu powder with a particle diameter of 10 to 25 (m, and 3 parts by weight of isopropyl alcohol as a convection additive was used as the solder resin paste. This solder paste was injected between the chip surface 10a and the upper surface of the mounting board 13 using a dispenser. The temperature was raised from the room temperature (25(C) to 250(C, and the mounted body was allowed to stand for 30 seconds. The mounted body then was cooled and the cross section thereof was observed, which revealed the state shown in FIG. 1.

The solder bumps 17 are formed in a self-assembled manner. Also, they are formed in a self-aligned manner with respect to the element electrodes 12 and electrode terminals 14. Accordingly, misalignment of the solder bumps 17 with respect to the element electrodes 12 and the electrode terminals 14 does not occur substantially, and the solder bumps 17 are formed automatically so as to correspond to the pattern of the element electrodes 12 and the electrode terminals 14.

The solder bumps 17 are formed by self-assembly of the solder particles in the solder resin paste 30. The convection additive is vaporize by the heating and discharged to the outside. It is to be noted that, after the solder bumps 17 have been formed, it is possible to wash away the solder resin paste 30 and then fill another resin (which may be the same type of resin).

By curing the resin included in the solder resin paste 30 (or another resin), the mounted body 100 according to the present embodiment is obtained. In the case where another resin is filled, a resin other than thermosetting resins (e.g., a thermoplastic resin, a photocurable resin, or the like) can be used as the resin included in the solder resin paste 30.

According to the embodiment of the present invention, the mounted body 100 in which the multilayer semiconductor chip 20 is mounted on the mounting board 13 can be realized by connecting the electrode terminals 14 on the mounting board 13 and the element electrodes 12 of the semiconductor chips 10 electrically to each other collectively via the solder bumps 17 formed in a self-assembled manner. Therefore, it is possible to manufacture the mounted body 100 provided with the multilayer semiconductor chip 20 easily.

Figure 13:
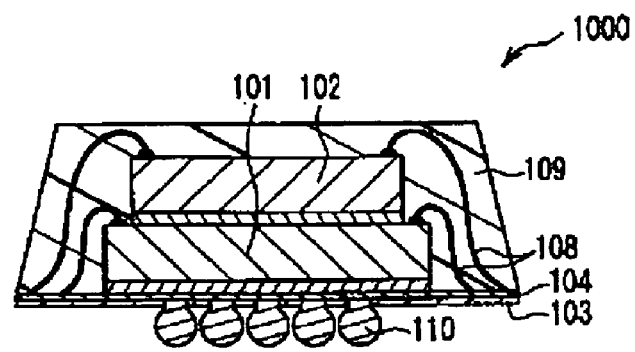
FIG. 13 is a cross-sectional view showing the configuration of a conventional stacked package.

More specifically, in the mounted body 100 according to the present embodiment, electric connection of the element electrodes 12 can be achieved collectively by the solder bumps 17 formed in a self-assembled manner. Thus, unlike the stacked package 1000 shown in FIG. 19 or FIG. 13, it is not necessary to connect wires one by one (the WB connection), so that the complexity related thereto can be eliminated.

That is, the element electrodes 12 and the electrode terminals 14 can be connected electrically to each other collectively with the solder bumps 17 without connecting them one by one as in the case of WB. Therefore, as compared with the WB, the time and effort required for the operation can be alleviated. Furthermore, since the electric connection by the solder bumps 17 can be achieved in a self-assembled manner, it can be performed more easily than in the WB method as long as the conditions therefor are set properly. In addition, a smaller equipment investment is required. Moreover, since the solder bumps 17 are formed in a self-aligned manner, the necessity of aligning them with high accuracy at the time of electric connection is eliminated and the problem of misalignment due to the tolerance can be avoided. Thus, the configuration of the present embodiment is extremely valuable from a technological viewpoint.

Figure 14:
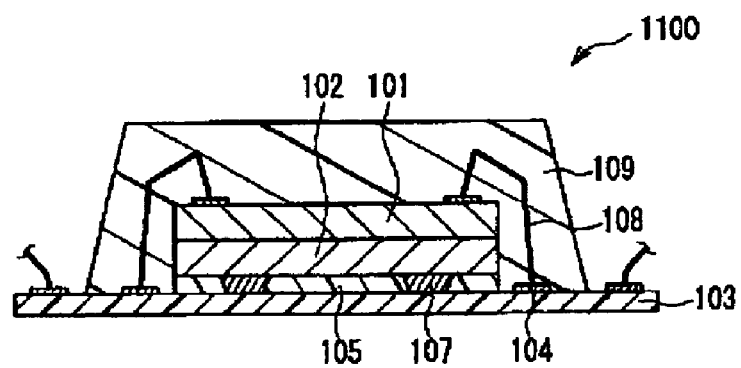
FIG. 14 is a cross-sectional view showing the configuration of another conventional stacked package.
Figure 15:
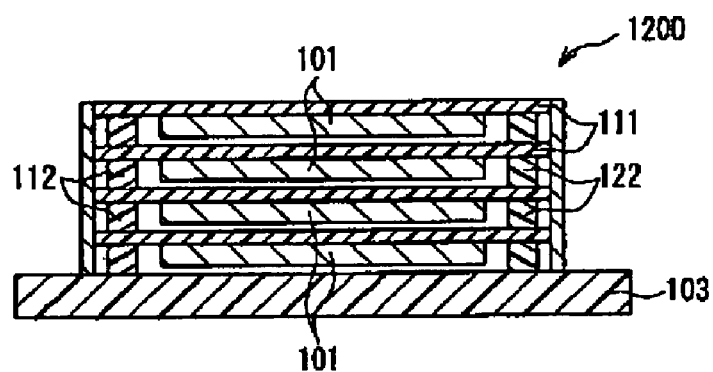
FIG. 15 is a cross-sectional view showing the configuration of still another conventional stacked package.
Figure 16:
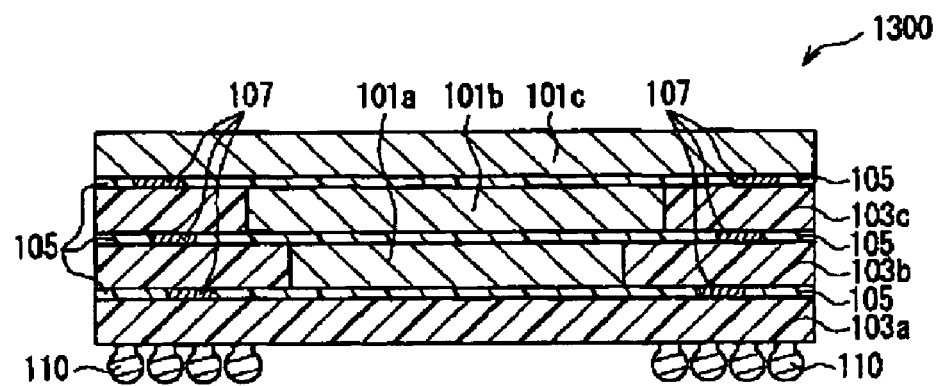
FIG. 16 is a cross-sectional view showing the configuration of still another conventional stacked package.
Figure 17:
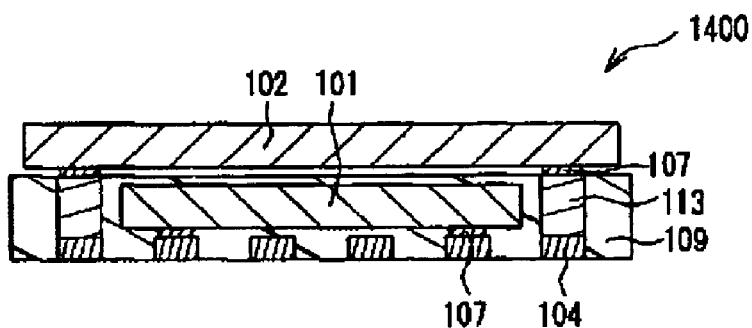
FIG. 17 is a cross-sectional view showing the configuration of still another conventional stacked package.
Figure 19:
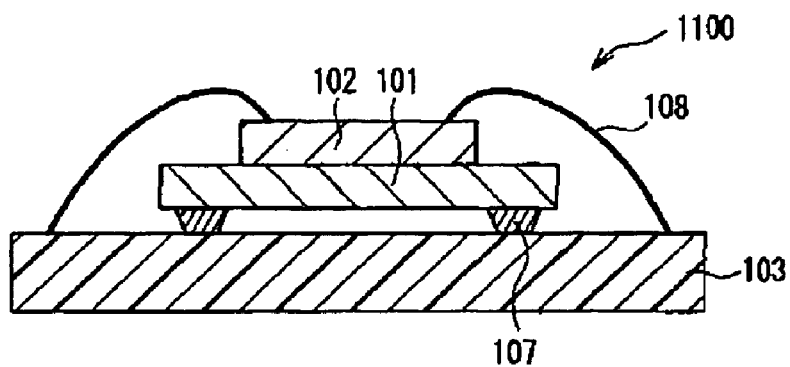
FIG. 19 is a cross-sectional view schematically showing the configuration of the conventional stacked package.

Moreover, unlike the stacked package 1100 shown in FIG. 19 or FIG. 14, performing both the WB and the FC is not necessary, so that the complexity related thereto can be eliminated. In addition, unlike the stacked package 1200 shown in FIG. 20 or FIG. 15, the mounted body according to the present embodiment can be constituted without using the interposer 111 or the spacer substrate 112, so that the complexity related thereto can be eliminated and also the problem of cost increase can be avoided. This also applies to the stacked packages 1300 and 1400 shown in FIGS. 16 and 17.

Figure 18:
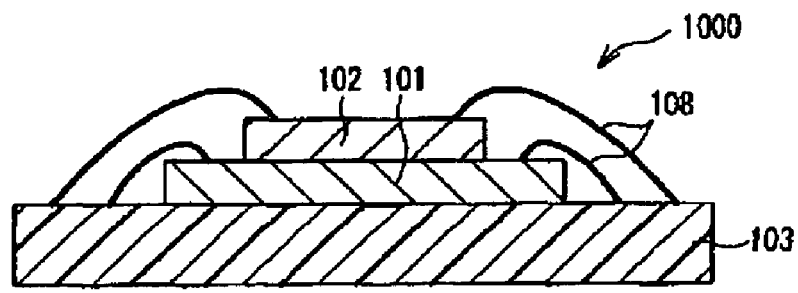
FIG. 18 is a cross-sectional view schematically showing the configuration of the conventional stacked package.
Figure 20:
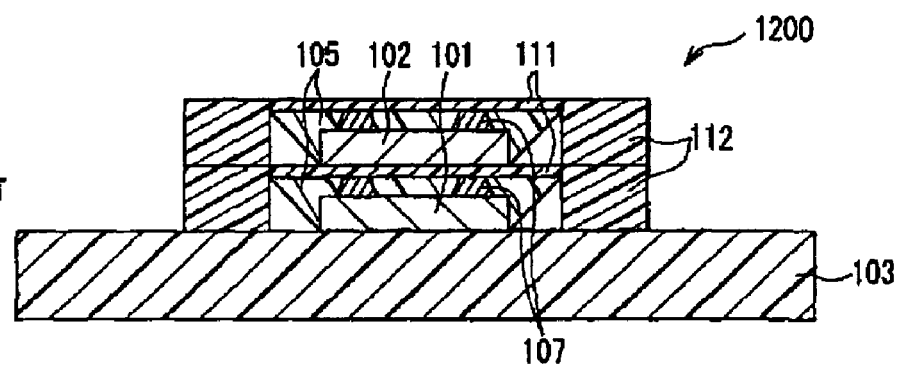
FIG. 20 is a cross-sectional view schematically showing the configuration of the conventional stacked package.

Since the stacked packages 1000 and 1100 shown in FIG. 18 and FIG. 19 employ WB and the stacked package 1200 shown in FIG. 20 uses the spacer substrates 112, the mounting area on the mounting board 103 side is large in these stacked packages. In contrast, according to the mounted body 100 of the present embodiment, it is possible to make the mounting area smaller than those in these stacked packages. In the configuration shown in FIG. 1, it is possible to achieve a mounting area that is the same or substantially the same as the area of the semiconductor chip 10b.

Besides, the presence of the wires 108 for the WB in the stacked packages 1000 and 1100 and the presence of the interposers 111 and the spacer substrates 112 in the stacked package 1200 make the thickness reduction difficult. In contrast, the thickness reduction of the mounted body 100 according to the present embodiment can be achieved more easily than that of the above-described stacked packages.

Furthermore, in the mounted body 100 according to the present embodiment, as shown in FIG. 1, since the wiring of the element electrodes 12 of the semiconductor chips 10 and the electrode terminals 14 of the mounting board 13 is realized, it is possible to increase the speed of signal processing and to reduce noises.

Furthermore, since the flip chip mounting is employed in the semiconductor chip 101 of the stacked package 1100 shown in FIG. 19, it is necessary for the semiconductor chip 101 to be mounted on the mounting board 103 with high alignment accuracy, which leads to cost increase. In contrast, in the mounted body 100 according to the present embodiment, the semiconductor chips 10 (10a, 10b) can be mounted in a self-aligned manner, so that the problem concerning with such a highly-accurate alignment can be avoided. Moreover, formation of the solder bumps 17 and the flip-chip mounting can be carried out as a single process (i.e., at the same time), which brings about a significant advantage. Furthermore, in some cases, the underfill 15 also can be formed at the same time as shown in FIG. 3C, which can bring about a still further advantage.

In the mounted body 100 according to the present embodiment, it is possible to use the element electrodes 12 of the semiconductor element 10, which are not provided with solder bumps, so that the cost increase can be suppressed accordingly. In particular, an advanced technique is required for the formation of the bumps on the element electrodes 12 that include a large number of pins and are arranged with a narrow pitch, resulting in an increase in cost. Thus, the fact that the formation need not be performed is highly advantageous. That is, unlike the case of the FC, there is an advantage in that the semiconductor chips 10 can be connected electrically to the mounting board 13 without forming the solder bumps on the element electrodes 12 beforehand.

Embodiment 2

Next, another method for manufacturing a mounted body 100 according to the present embodiment will be described with reference to FIGS. 4A to 4C.

Figure 4A:
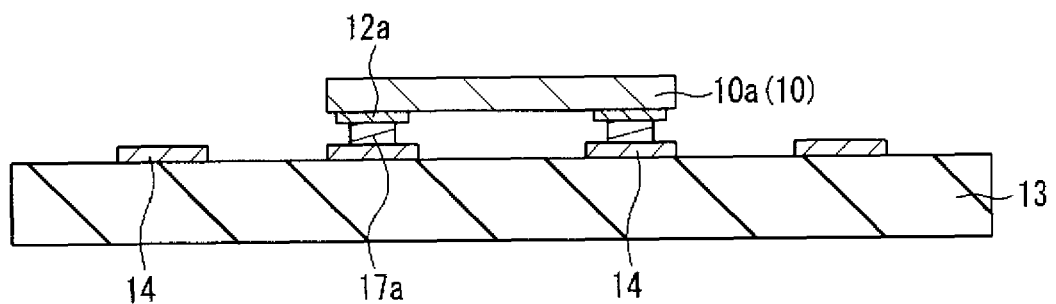
FIGS. 4A to 4C are cross-sectional views illustrating major steps in a method for manufacturing a mounted body according to Embodiment 2 of the present invention.

First, as shown in FIG. 4A, a first semiconductor chip 10a is mounted on a mounting board 13. This mounting is achieved by flip-chip mounting via solder bumps formed in a self-assembled manner. In other words, solder bumps 17a are formed in a self-assembled manner by performing the steps shown in FIGS. 3A to 3C in the state where the second semiconductor chip 10b is not provided, i.e., by performing the joining steps with solder using the first semiconductor chip 10a alone. When a resin included in a solder resin paste 30 is used as it is, an underfill is obtained, resulting in the configuration shown in FIG. 4B. Alternatively, the resin included in the solder resin paste 30 may be removed once to obtain the configuration shown in FIG. 4A and then a space between the first semiconductor chip 10a and the mounting board 13 may be filled with an underfill.

Figure 4B:
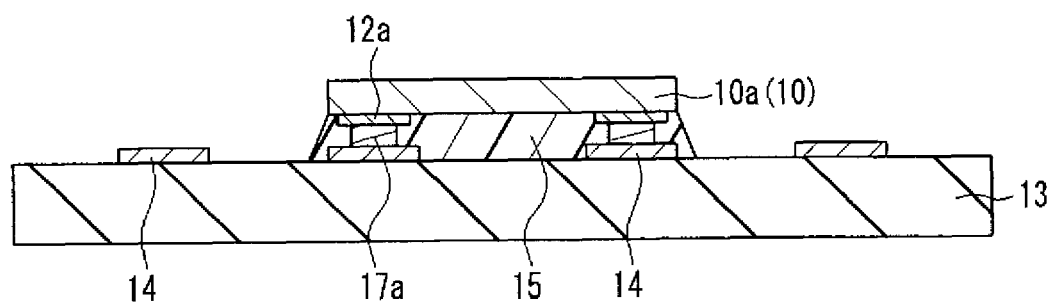

Next, on the first semiconductor chip 10a in the configuration shown in FIG. 4B, a second semiconductor chip 10b is placed and the solder resin paste 30 is supplied between the second semiconductor chip 10b and the mounting board 13. Note here that the second semiconductor chip 10b may be placed first and the solder resin paste 30 then may be filled, or alternatively, the solder resin paste 30 may be applied first and the second semiconductor chip 10b then may be placed. Next, through the steps similar to those shown in FIGS. 3A to 3C, solder bumps 17b are formed in a self-assembled manner.

Figure 4C:
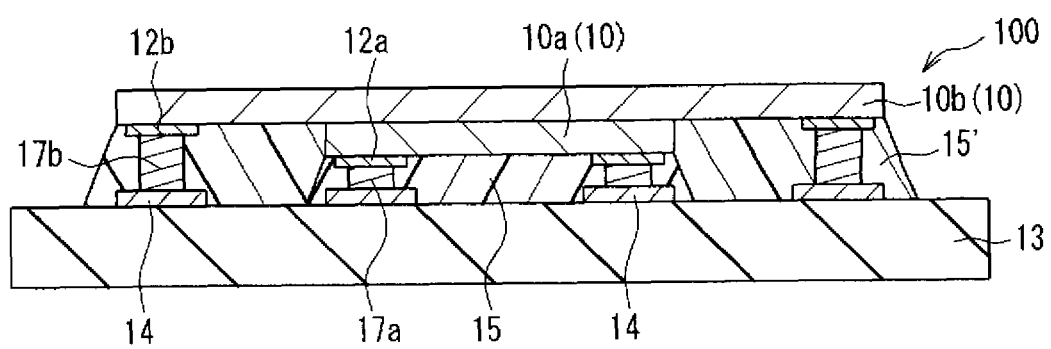

When the resin included in the solder resin paste 30 is used as it is, an underfill 15' is obtained, so that a mounted body 100 having the configuration shown in FIG. 4C is obtained.

Embodiment 3

Figure 5A:
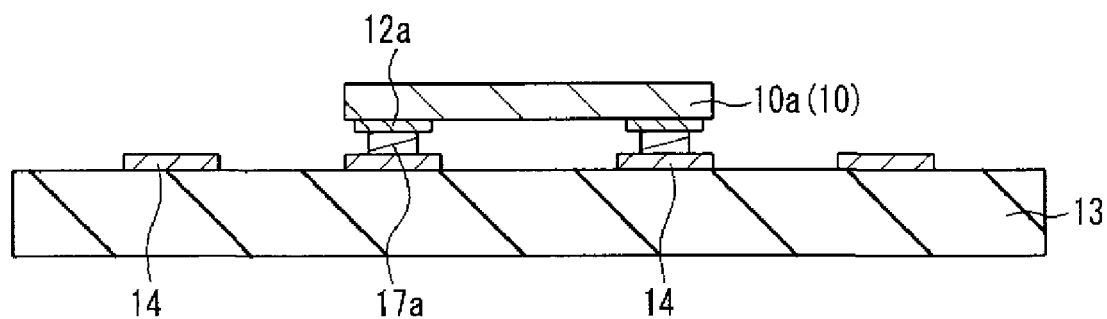
FIGS. 5A and 5B are cross-sectional views illustrating major steps in a method for manufacturing a mounted body according to Embodiment 3 of the present invention.
Figure 5B:
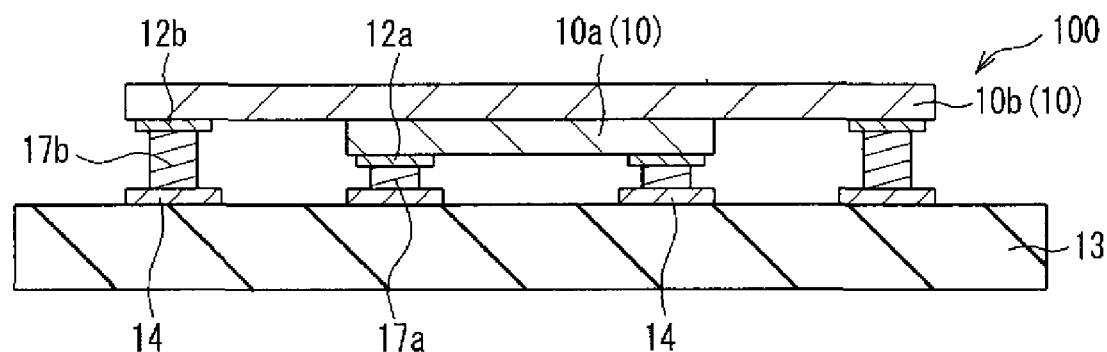

Next, a mounted body 100 according to the present embodiment can be manufactured as shown in FIGS. 5A and 5B.

First, the configuration shown in FIG. 5A is provided in the same manner as that described with regard to FIG. 4A. In the configuration shown in FIG. 5A, the resin between a first semiconductor chip 10a and a mounting board 13 is removed. Next, on the first semiconductor chip 10a, a second semiconductor chip 10b is placed and a solder resin paste 30 is supplied between the second semiconductor chip 10b and the mounting board 13. Thereafter, through the steps similar to those shown in FIGS. 3A to 3C, solder bumps 17b are formed in a self-assembled manner. When the resin included in the solder resin paste 30 is used as it is, an underfill can be formed, and the configuration shown in FIG. 5B can be obtained by removing this resin.

According to the manufacturing method illustrated in FIGS. 4A to 4C, the solder bumps 17a are reinforced by the resin (the underfill) 15 as shown in FIG. 4B. Therefore, when forming the solder bumps in a self-assembled manner for the second time (i.e., the formation of the solder bumps 17b), it is possible to suppress the melting of the solder bumps 17a. On the other hand, according to the manufacturing method shown in FIGS. 5A and 5B, the solder bumps 17a formed first might be melted when forming solder bumps in a self-assembled manner for the second time (i.e., the formation of the solder bumps 17b). On the contrary, it is also possible to melt the solder bumps 17a so as to allow them to be formed in a self-aligned manner together with the solder bumps 17b. Which of the above-described manufacturing methods is adapted may be determined as appropriate depending on manufacturing conditions etc.

Embodiment 4

Next, application examples of a mounted body 100 according to the present embodiment will be described with reference to FIGS. 6 to 9.

Figure 6:
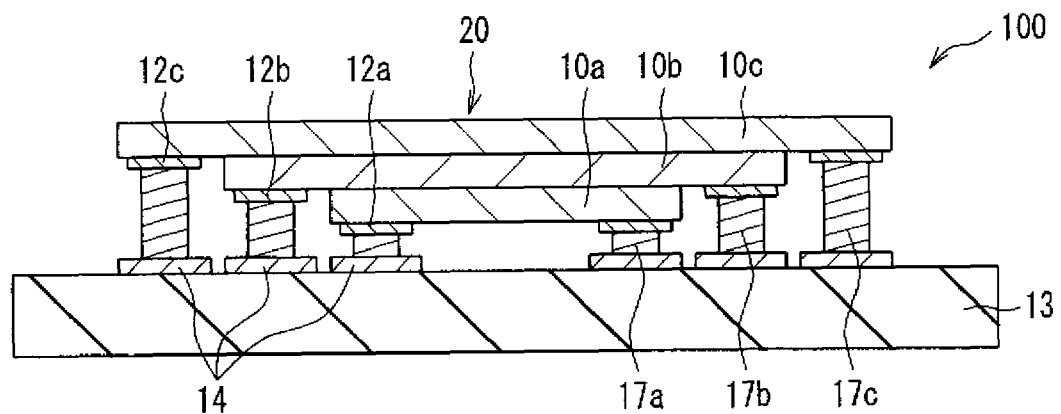
FIG. 6 is a cross-sectional view schematically showing a mounted body according to Embodiment 4 of the present invention.

FIG. 6 shows the configuration of a mounted body 100 in which a multilayer semiconductor chip 20 including three semiconductor chips 10 (10a, 10b, 10c) is mounted on a mounting board 13. The respective semiconductor chips 10 (10a, 10b, 10c) are connected to the mounting board 13 collectively via solder bumps 17 (17a, 17b, 17c) formed in a self-assembled manner. Of course, in the configuration shown in FIG. 6, it is also possible to form an underfill 15 as shown in FIG. 2.

Figure 7:
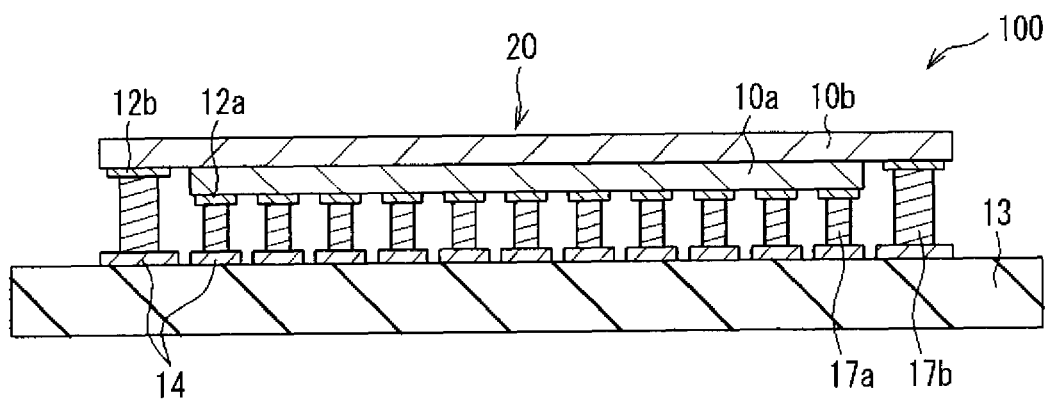
FIG. 7 is a cross-sectional view schematically showing an application example of the mounted body according to Embodiment 4 of the present invention.

FIG. 7 shows the configuration of a mounted body 100 in which an area array-type semiconductor chip is employed as a lower semiconductor chip 10a. Since the area array-type semiconductor chip 10a is employed in this configuration, this configuration is applicable when a large number of pins are provided and the pitch is narrow.

Figure 8:
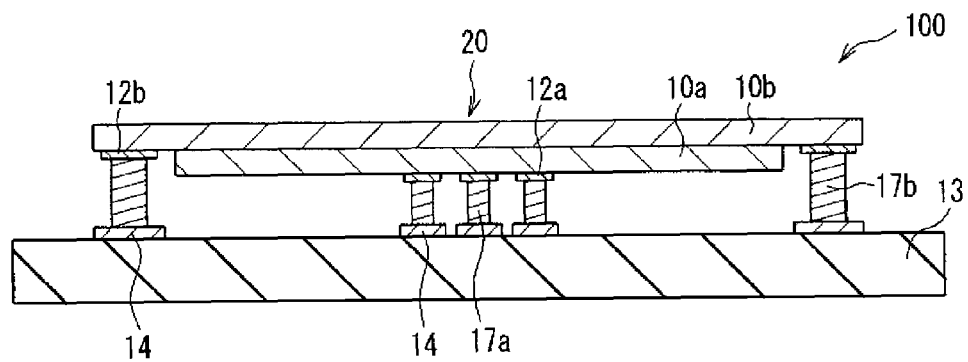
FIG. 8 is a cross-sectional view schematically showing an application example of the mounted body according to Embodiment 4 of the present invention.
Figure 9:
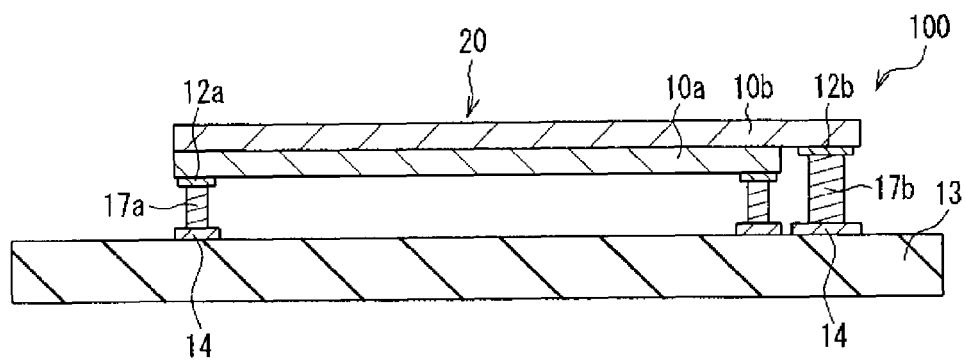
FIG. 9 is a cross-sectional view schematically showing an application example of the mounted body according to Embodiment 4 of the present invention.

FIG. 8 shows the configuration of a mounted body 100 that employs, as a lower semiconductor chip 10a, a semiconductor chip in which element electrodes 12a are formed in a central portion on the chip surface, rather than in a peripheral region of the chip surface. Such a configuration also can be employed. Also, it is possible to employ the configuration in which a semiconductor chip 10b having element electrodes 12b on one side as shown in FIG. 9. By using these configurations, it is possible to cope with various arrangements of pad electrodes (element electrodes or electrode terminals).

Embodiment 5

Figure 10:
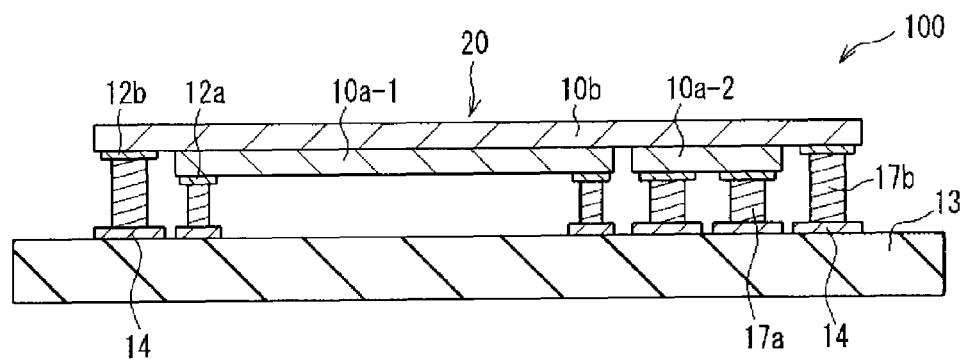
FIG. 10 is a cross-sectional view schematically showing a mounted body according to Embodiment 5 of the present invention.

In the present embodiment, as shown in FIG. 10, a mounted body 100 according to the present embodiment can be configured by arranging a plurality of chips (10a-1, 10a-2) in parallel as first semiconductor chips 10a serving as lower semiconductor chips.

Embodiment 6

Figure 11:
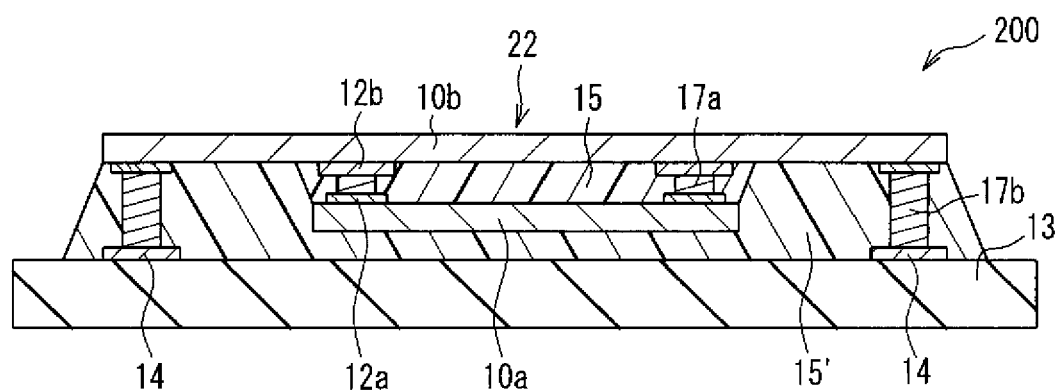
FIG. 11 is a cross-sectional view schematically showing the configuration of a mounted body according to Embodiment 6 of the present invention.

Furthermore, according to an embodiment of the present invention, it is possible to configure a mounted body 200 as shown in FIG. 11. The mounted body 200 shown in FIG. 11 has a COC module (a chip-on-chip module) 22 in which a first semiconductor chip 10a is connected electrically to a second semiconductor chip 10b via solder bumps 17a, and the COC module 22 is mounted on a mounting board 13 via solder bumps 17b formed in a self-assembled manner. As the solder bumps 17a of the COC module 22, it is also possible to use solder bumps that are formed in a self-assembled manner. In this example, an underfill 15 is formed between the first semiconductor chip 10a and the second semiconductor chip 10b, and an underfill 15' is formed between the COC module 22 and the mounting board 13.

Embodiment 7

Figure 12:
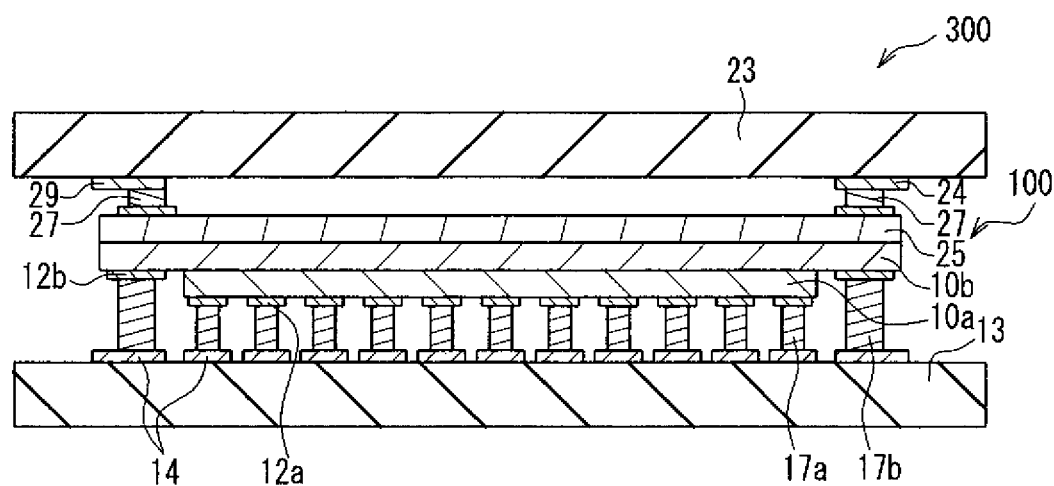
FIG. 12 is a cross-sectional view schematically showing the configuration of a multilayer substrate module according to Embodiment 7 of the present invention

A multilayer substrate module 300 as shown in FIG. 12 can be configured by a technique according to the present embodiment. In the multilayer substrate module 300 shown in FIG. 12, a semiconductor chip 25 is placed on a mounted body 100 according to the present embodiment, and this semiconductor chip 25 is connected to electrode terminals 24 of a mounting board 23 via connecting members 27. The configuration of this multilayer substrate module 300 is useful for the construction of a larger scale module including a chip-stacked semiconductor mounted body 100 and configured so that the substrates included therein are connected to each other.

The present invention has been described by way of preferred embodiments. It should be noted, however, the present invention is by no means limited by the description of these preferred embodiments, and needless to say, various changes can be made to the present invention.

Although the above-described embodiments of the present invention are directed to the case where the semiconductor chip (semiconductor element) 10 is a bare chip, the semiconductor chip 10 is not limited to a bare chip, and can be a semiconductor package such as a chip size package (CSP), for example. Although the semiconductor chip 10 typically is a memory IC chip, a logic IC chip, or a system LSI chip, the type of the semiconductor chip 10 is not particularly limited.

The mounted bodies or the multilayer substrate module according to the embodiments of the present invention can be mounted suitably on thin and small electronic equipment with a limited mounting area. They can be used not only in mobile phones but also in PDAs and notebook computers, and also are applicable to other uses (e.g., digital still cameras, wall hung-type thin televisions (FPD; Flat Panel Display)).

INDUSTRIAL APPLICABILITY

According to the present invention, a mounted body on which a multilayer semiconductor chip (a stacked package) is mounted can be manufactured easily.

The invention claimed is:

1. A method for manufacturing a mounted body, the method comprising the steps of:
   providing a solder resin paste between a multilayer semiconductor chip comprising a plurality of semiconductor chips that are stacked and a mounting board on which the multilayer semiconductor chip is mounted including areas where a solder bump is not to be formed, the solder resin paste containing a resin, a solder powder, and a convection additive that boils when heated; and
   heating the solder resin paste so that motion of the boiling convection additive in the resin gives kinetic energy to solder particles dispersed in the resin to promote a movement of the solder particles, thus causing the solder powder to assemble to form the solder bump, whereby an element electrode of each semiconductor chip of the multilayer semiconductor chip and an electrode terminal formed on the mounting board so as to correspond to the element electrode are connected electrically to each other collectively.

2. The method according to claim 1, wherein, in the multilayer semiconductor chip, at least the semiconductor chip adjacent to the mounting board is a thin semiconductor chip having a thickness of 100 μm or less.

3. The method according to claim 1, wherein the solder powder has a melting point in a range from 10° C. to 330° C.

4. A method for manufacturing a mounted body, the method comprising the steps of:
   providing a solder resin paste between a first semiconductor chip and a mounting board on which the first semiconductor chip is mounted including areas where a first solder bump is not to be formed, the solder resin paste containing a resin, a solder powder, and a convection additive that boils when heated;
   heating the solder resin paste so that motion of the boiling convection additive in the resin gives kinetic energy to solder particles dispersed in the resin to promote a movement of the solder particles, thus causing the solder powder to assemble to form the first solder bump, whereby an element electrode of the first semiconductor chip and an electrode terminal formed on the mounting board so as to correspond to the element electrode are connected electrically to each other collectively;
   joining a second semiconductor chip having a principal surface to be joined to a rear surface of the first semiconductor chip and a second element electrode formed on the principal surface to the rear surface of the first semiconductor chip, and providing the solder resin paste between the mounting board and the second semiconductor chip including areas where a second solder bump is not to be formed; and
   heating the solder resin paste so that motion of the boiling convection additive in the resin gives kinetic energy to solder particles dispersed in the resin to promote a movement of the solder particles, thus causing the solder powder to assemble to form the second solder bump, whereby the element electrode of the second semiconductor chip and an electrode terminal formed on the mounting board so as to correspond to the element electrode are connected electrically to each other collectively.

5. The method according to claim 4, wherein, in the multilayer semiconductor chip, at least the semiconductor chip adjacent to the mounting board is a thin semiconductor chip having a thickness of 100 μm or less.

6. The method according to claim 4, wherein the solder powder has a melting point in a range from 10° C. to 330° C.

7. The method according to claim 1, wherein the convection additive generates heat when the resin is heated.

8. The method according to claim 1, wherein the convection additive is a compound containing crystal water, a compound decomposed by being heated, or a foaming agent.

9. The method according to claim 4, wherein the convection additive generates heat when the resin is heated.

10. The method according to claim 4, wherein the convection additive is a compound containing crystal water, a compound decomposed by being heated, or a foaming agent.

11. The method according to claim 1, wherein only the solder resin paste is used to join the semiconductor chip to the mounting board.

12. The method according to claim 1, wherein the resin in the solder resin paste forms into an underfill between the semiconductor chip and the mounting board.

13. A method for manufacturing a mounted body, the method comprising the steps of:
   providing a solder resin paste that simultaneously provides a resin for joining a semiconductor chip to a mounting board, and a solder powder for forming an electrical connection between the semiconductor chip and the mounting board between the multilayer semiconductor chip comprising a plurality of semiconductor chips that are stacked and a mounting board on which the multilayer semiconductor chip is mounted, the solder resin paste containing the resin, the solder powder, and a convection additive that boils when heated; and
   heating the solder resin paste so that motion of the boiling convection additive in the resin gives kinetic energy to solder particles dispersed in the resin to promote a movement of the solder particles, thus causing the solder powder to assemble to form a solder bump, whereby an element electrode of each semiconductor chip of the multilayer semiconductor chip and an electrode terminal formed on the mounting board so as to correspond to the element electrode are connected electrically to each other collectively.

* * * * *